United States Patent
Lu et al.

(10) Patent No.: US 9,230,810 B2
(45) Date of Patent: Jan. 5, 2016

(54) SYSTEM AND METHOD FOR SUBSTRATE WAFER BACK SIDE AND EDGE CROSS SECTION SEALS

(75) Inventors: Hamilton Lu, Los Angeles, CA (US); The-Tu Chau, San Jose, CA (US); Kyle Terrill, Santa Clara, CA (US); Deva N. Pattanayak, Saratoga, CA (US); Sharon Shi, San Jose, CA (US); Kuo-In Chen, Los Altos, CA (US); Robert Xu, Fremont, CA (US)

(73) Assignee: Vishay-Siliconix, Santa Clara, CA (US)

(*) Notice: Subject to any disclaimer, the term of this patent is extended or adjusted under 35 U.S.C. 154(b) by 585 days.

(21) Appl. No.: 12/873,147

(22) Filed: Aug. 31, 2010

(65) Prior Publication Data

US 2011/0049682 A1    Mar. 3, 2011

Related U.S. Application Data

(60) Provisional application No. 61/239,729, filed on Sep. 3, 2009.

(51) Int. Cl.
| | | |
|---|---|---|
| *H01L 21/322* | (2006.01) | |
| *H01L 21/20* | (2006.01) | |
| *H01L 21/22* | (2006.01) | |
| *H01L 29/78* | (2006.01) | |

(52) U.S. Cl.
CPC ......... *H01L 21/2205* (2013.01); *H01L 29/7813* (2013.01)

(58) Field of Classification Search
CPC ............. H01L 21/2205; H01L 21/02532; H01L 21/02381; H01L 21/02658; H01L 21/02639

USPC .......... 438/471, 476, 495, 506, 455; 257/339, 257/E21.127, E21.098, E21.112
See application file for complete search history.

(56) References Cited

U.S. PATENT DOCUMENTS

| | | | |
|---|---|---|---|
| 5,292,679 A | 3/1994 | Anzai | |
| 6,274,904 B1* | 8/2001 | Tihanyi | 257/329 |
| 6,300,171 B1 | 10/2001 | Frisina | |
| 7,759,733 B2* | 7/2010 | Ono et al. | 257/341 |
| 2002/0098655 A1 | 7/2002 | Zheng et al. | |
| 2003/0164513 A1 | 9/2003 | Ping et al. | |
| 2004/0108568 A1* | 6/2004 | Qu | 257/500 |
| 2005/0106849 A1* | 5/2005 | Gwo | 438/602 |
| 2006/0029817 A1* | 2/2006 | Hall | 428/446 |
| 2007/0045709 A1 | 3/2007 | Yang | |

(Continued)

FOREIGN PATENT DOCUMENTS

| | | |
|---|---|---|
| JP | 2170415 | 7/1990 |
| JP | 2002203963 | 7/2002 |

(Continued)

*Primary Examiner* — Whitney T Moore
*Assistant Examiner* — Scott Stowe

(57) ABSTRACT

Systems and methods for substrate wafer back side and edge cross section seals. In accordance with a first method embodiment, a silicon wafer of a first conductivity type is accessed. An epitaxial layer of the first conductivity type is grown on a front surface of the silicon wafer. The epitaxial layer is implanted to form a region of an opposite conductivity type. The growing and implanting are repeated to form a vertical column of the opposite conductivity type. The wafer may also be implanted to form a region of the opposite conductivity type vertically aligned with the vertical column.

2 Claims, 5 Drawing Sheets

(56) References Cited

U.S. PATENT DOCUMENTS

2007/0290267 A1    12/2007    Yoshikawa et al.
2008/0116461 A1    5/2008    Wu et al.

FOREIGN PATENT DOCUMENTS

| | | |
|---|---|---|
| JP | 2011204146 | 10/2011 |
| WO | 8605922 | 10/1986 |

* cited by examiner

SYSTEM AND METHOD FOR SUBSTRATE WAFER BACK SIDE AND EDGE CROSS SECTION SEALS

RELATED APPLICATION

This application claims priority to U.S. Provisional Application 61/239,729, filed Sep. 3, 2009, entitled "System and Method for Substrate Wafer Back Side and Edge Cross Section Seals" to Lu et al., which is hereby incorporated herein by reference in its entirety.

TECHNICAL FIELD

Embodiments of the present invention relate to the fields of design and manufacture of semiconductors, and more particularly to systems and methods for substrate wafer back side and edge cross section seals.

BACKGROUND

Epitaxy is a process by which a single crystal, for example Silicon, is grown on or deposited on a single crystal substrate. Exemplary processes include chemical vapor deposition (CVD), wherein gas phase Silicon sources, such as silicon tetrachloride ($SiCl_4$), trichlorosilane ($SiHCl_3$), dichlorosilane ($SiH_2Cl_2$) and/or silane ($SiH_4$) in a hydrogen carrier gas, are passed over a silicon substrate at a high temperature, e.g., about 700° C. to 1200° C., resulting in an epitaxial growth process. It is appreciated that epitaxial processes may grow non-Silicon materials as well.

Epitaxy is an important process in semiconductor manufacturing, and is often used to grow layers of pre-doped silicon on the polished planar surfaces of silicon wafers, before they are processed into semiconductor devices. Epitaxy is commonly used in the fabrication of power semiconductor devices, such as those used in computer power supplies, pacemakers, vending machine controllers, automobile computers, and the like.

FIG. 1A (conventional art) illustrates one well known deleterious side effect of epitaxial growth, known as "auto-doping." Auto doping is a process by which dopants originating from the substrate 110 migrate into the epitaxial layer 120, deleteriously changing the doping profile of the epitaxial layers. It is appreciated that dopant migration may take a variety of paths from a substrate to an epitaxial layer, including, for example, liberation into the process gas(ses). In general, auto doping may lead to numerous adverse effects, including, for example, reduced breakdown voltage of the epitaxial layer. Additionally, the auto doping process is generally neither controlled nor predictable. Thus, auto doping leads to numerous detrimental effects.

A wafer may have an optional oxide seal 125 on the back side. Oxide seal 125 is generally intended to reduce autodoping. However, oxide seal 125 may corrode and be subject to "pin-hole" defects during multiple cleaning processes between multiple epitaxial layer growth processes. When oxide seal 125 is subject to such corrosion, the oxide seal 125 fails to prevent auto doping.

An additional problem with epitaxial processes occurs when epitaxy undesirably grows on the back side of a wafer. FIG. 1B (conventional art) illustrates an irregular silicon "bump" or nodule 130 that has formed the back or opposite side of wafer 110/oxide seal 125 due to exposure to process gasses. Pin-hole defects of oxide seal 125 are prime locations for formations of such nodules, although such nodules may form at other locations, including in the absence of oxide seal 125. Such bumps are typically not uniform. For example, such inadvertent back-side epitaxial growth does not form a unified, smooth layer, but rather forms a plurality of irregular bumps. Such nodules present an uneven wafer backside, which may interfere with many subsequent semiconductor processing steps, as they prevent accurate alignment of the wafer in processing machinery. For example, as illustrated in FIG. 1B, the wafer 110 cannot lay flat due to nodule 130.

While there are many systems and methods to mitigate both auto doping and inadvertent back side epitaxial growth, including acceptance of the effects, such conventional art approaches are not acceptable in all circumstances. In addition, it is known to utilize multiple epitaxial layers. In such a circumstance, the accumulation of auto doping and/or back side nodules due to multiple epitaxial growth processes may overwhelm or otherwise find unsatisfactory conventional mitigation techniques.

SUMMARY

Accordingly, systems and methods for substrate wafer back side and edge cross section seals are desired. In addition, systems and methods of forming multiple epitaxial layers without the accumulation of deleterious side effects is desired. Further, systems and methods of forming multiple epitaxial layers with vertical trenches and/or vertical doped columns are desired. Still further, systems and methods for substrate wafer back side and edge cross section seals that are compatible and complementary with conventional wafer processing systems are desired. Embodiments in accordance with the present invention provide for these needs.

Systems and methods for substrate wafer back side and edge cross section seals are disclosed. In accordance with a first method embodiment, a silicon wafer of a first conductivity type is accessed. An epitaxial layer of the first conductivity type is grown on a front surface of the silicon wafer. The epitaxial layer is implanted to form a region of an opposite conductivity type. The growing and implanting are repeated to form a vertical column of the opposite conductivity type. The wafer may also be implanted to form a region of the opposite conductivity type vertically aligned with the vertical column.

In accordance with a second method embodiment, a layer of silicon oxide is deposited on all surfaces and edges of the silicon wafer. The silicon oxide is removed from a front surface of the silicon wafer. A layer of poly silicon is deposited on a back surface of the silicon wafer, over the silicon oxide. A layer of epitaxial silicon is grown on the front side of the silicon wafer. Auto doping of the layer of epitaxial silicon may be reduced relative to auto doping occurring during epitaxial silicon growth on a wafer without the layer of silicon oxide.

In accordance with another embodiment of the present invention, a semiconductor device includes a silicon substrate including bulk silicon, and a plurality of stacked epitaxial silicon layers disposed on a front side of the substrate. Each of the plurality of epitaxial silicon layers includes a doped region forming in aggregate a vertical doped column in the semiconductor device.

BEST MODES FOR CARRYING OUT THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Figure 1A:
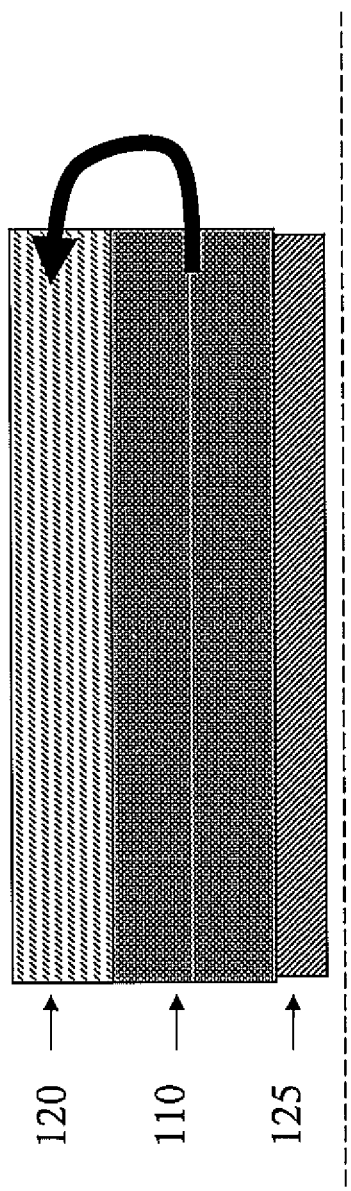
FIG. 1A (conventional art) illustrates one well known deleterious side effect of epitaxial growth, known as "auto-doping."
Figure 2A:
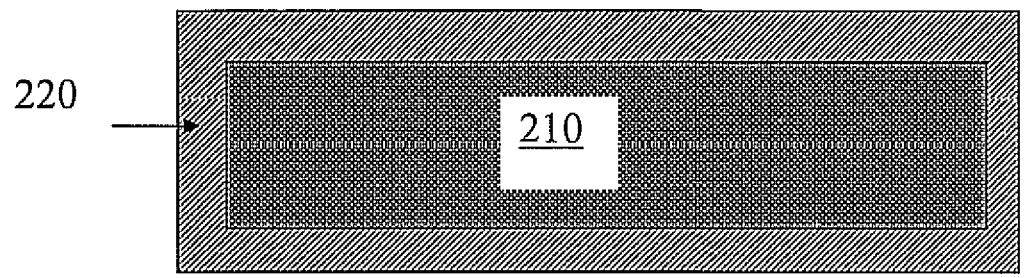
FIGS. 2A, 2B and 2C illustrate a process of sealing a wafer substrate to prevent auto doping and/or back side nodule growth, in accordance with embodiments of the present invention.
Figure 2B:
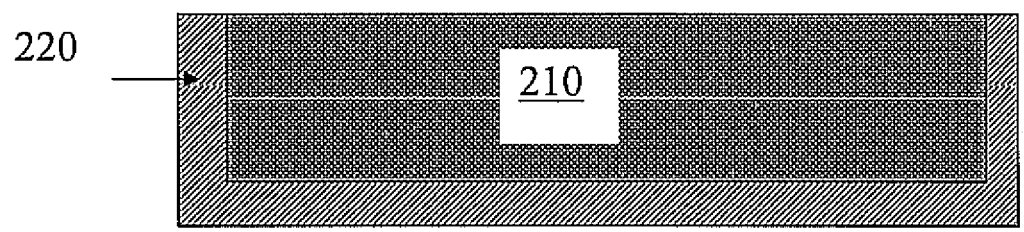
Figure 2C:
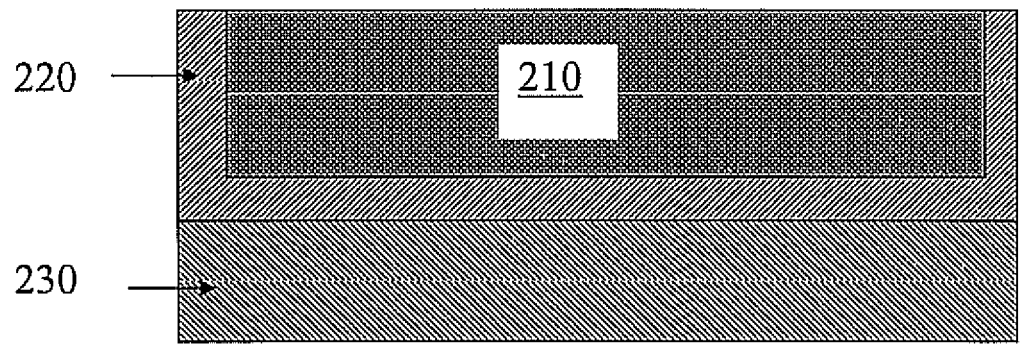

FIGS. 2A-2C illustrate a process of sealing a wafer substrate to prevent auto doping and/or back side nodule growth, in accordance with embodiments of the present invention. In FIG. 2A, a silicon substrate 210 is uniformly coated with Silicon oxide 220 to a thickness of about 800 to 1200 angstroms, e.g., about 1000 angstroms. Item 210 may also comprise an oxide seal, e.g., oxide seal 125 of FIG. 1A, on its back side, in an embodiment. For example, Silicon oxide 220 is deposited on the front, back and edges of wafer 210.

In FIG. 2B, the top portion of Silicon oxide coating 220, e.g., that portion of Silicon oxide 220 above the top or front of wafer 210, is removed, e.g., by polishing. It is appreciated that a small amount of the top side of wafer 210 may be removed as well.

In FIG. 2C, a layer 230 of poly Silicon is deposited on the back side of wafer 210 over the Silicon oxide 220. For example, the Silicon oxide 220 is against wafer 210, and the poly silicon 230 is against the Silicon oxide 220. The poly Silicon 230 has a thickness of about 8000 to 9000 angstroms, e.g., about 8500 angstroms. The poly Silicon 230 is deposited in such a manner that it is only deposited on the back side of the wafer, in an embodiment. One suitable process is deposition via chemical vapor deposition on a silicon carbide susceptor in a sealed wafer environment.

It is to be appreciated that the process operations illustrated in FIGS. 2B and 2C may occur in a different order from that illustrated. For example, poly Silicon may be deposited on all surfaces of a wafer, and subsequently removed from the front side, for example, in conjunction with the removal of the top portion of Silicon oxide coating 220, in accordance with embodiments of the present invention.

Figure 1B:
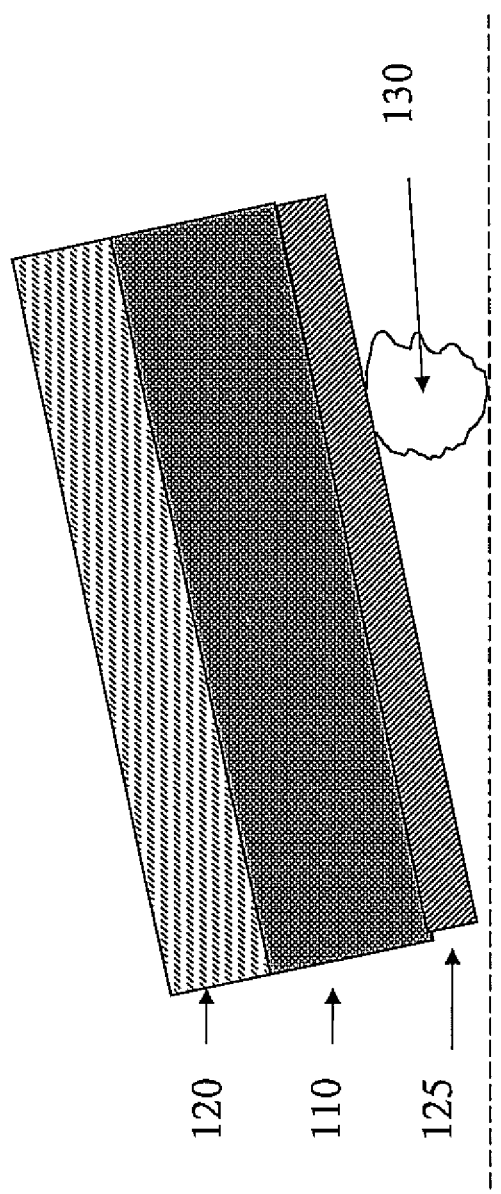
FIG. 1B (conventional art) illustrates an irregular silicon "bump" or nodule that has formed the back or opposite side of a wafer due to exposure to process gasses.

In accordance with embodiments of the present invention, the Silicon oxide coating 220 prevents auto doping during epitaxial growth. For example, Silicon oxide coating 220 prevents migration of dopants from wafer 210 into a process gas mixture used to form an epitaxial layer. In addition, in accordance with embodiments of the present invention, the poly Silicon 230 prevents the growth of non-uniform nodules on the back side of wafer 210. For example, the poly Silicon 230 provides uniform nucleation for epitaxial Silicon growth. Thus, while epitaxial material may still grow on the back side of wafer 210, such growth is substantially uniform, e.g., it forms a smooth layer, in contrast to the deleterious non-uniform nodules that may form directly on the back side of an uncoated wafer, as shown in FIG. 1B, as may occur under the conventional art.

Figure 3A:
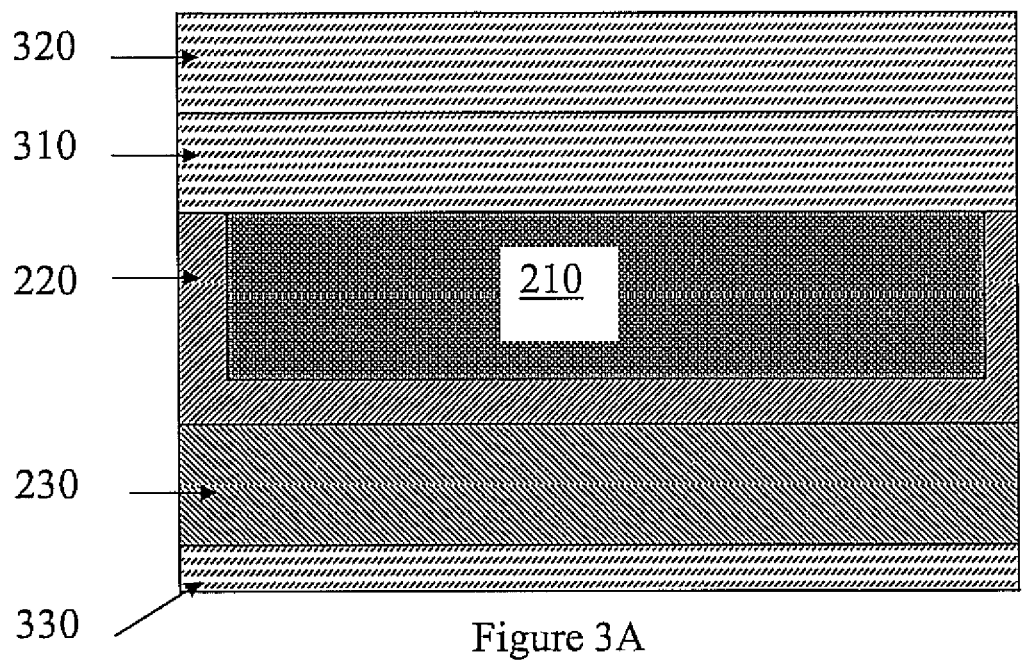
FIG. 3A illustrates epitaxial growth on a sealed wafer, in accordance with embodiments of the present invention.

FIG. 3A illustrates epitaxial growth on a sealed wafer, in accordance with embodiments of the present invention. Wafer 210 is coated on the bottom and edges with Silicon oxide 220. The bottom of wafer 210 is coated with poly Silicon 230, deposited over a portion of Silicon oxide 220.

Epitaxial layer 310 has been grown on the front/top surface of wafer 210. Optionally, epitaxial layer 320 has been grown on the top surface of epitaxial layer 310. It is appreciated that epitaxial layer 320 may have a different thickness and/or doping composition from that of epitaxial layer 310. Due to the sealing effects of Silicon oxide 220, no deleterious auto doping has occurred during the epitaxial growth process(es), and the epitaxial layer(s) 310, 320, beneficially have the desired doping characteristics.

FIG. 3A further illustrates a substantially uniform layer of epitaxy 330 on the bottom side of wafer 210. Layer 330 is formed during the growth of layers 310 and/or 320. Layer 330 does not subject the wafer 210 to the deleterious handling effects of non-uniform silicon nodules, e.g., as shown by nodule 130 of FIG. 1B.

Figure 3B:
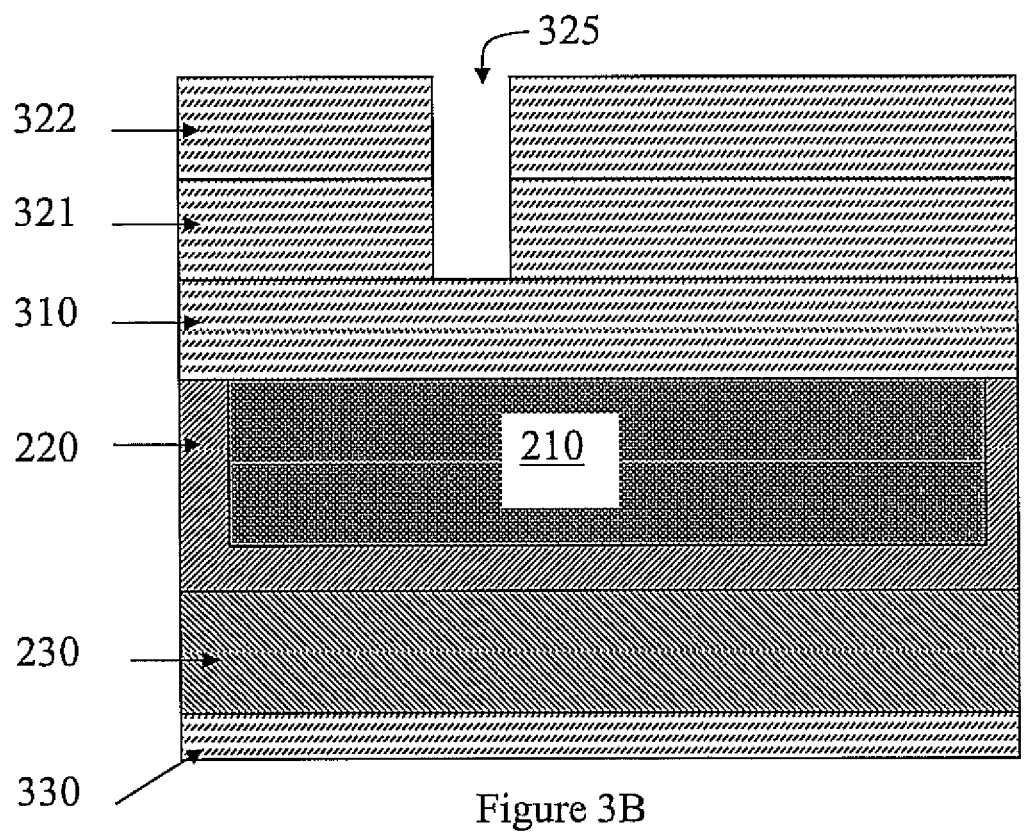
FIG. 3B illustrates non-uniform, e.g., selective, epitaxial growth of an epitaxial layer on the front/top surface of an epitaxial layer, in accordance with embodiments of the present invention.

In accordance with embodiments of the present invention, the epitaxial growth on the front/top surface of wafer 210 need not be uniform. FIG. 3B illustrates non-uniform, e.g., selective, epitaxial growth of epitaxial layer 321 on the front/top surface of epitaxial layer 310, in accordance with embodiments of the present invention. For example, the lack of epitaxial growth in a region has formed a trench 325. The formation of layer 321 is well suited to a variety of well known processes for selective epitaxial growth. For example, a region on an underlying area, e.g., epitaxial layer 310 or substrate 210, in the region of trench 325, may be masked by a dielectric film, e.g., silicon dioxide or silicon nitride, prior to epitaxial growth.

Similarly, a plurality of epitaxial layers may be growth, either uniformly, as illustrated by layers 310 and 320, or non-uniformly, as illustrated by layers 321 and 322. As a beneficial consequence, features such as trench 325 may be constructed by a lack of formation of material, in contrast to processes that form such features via the removal of material. It is appreciated that the dopant concentration of each epitaxial layer may be different, so as to form a desirable doping profile. It is to be further appreciated that many epitaxial layers may be grown, of varying thickness and/or doping characteristic, such that a feature, e.g., trench 325, may have a desirable depth. Of course, trench 325 may terminate at a substrate, e.g., substrate 220, or within one of a plurality of epitaxial layers, e.g., 310, 321, 322, and the like.

Further, embodiments in accordance with the present invention may be combined with other methods of trench formation, e.g., methods that remove material, to form trenches that terminate within a substrate, e.g., within substrate 220.

Figure 3C:
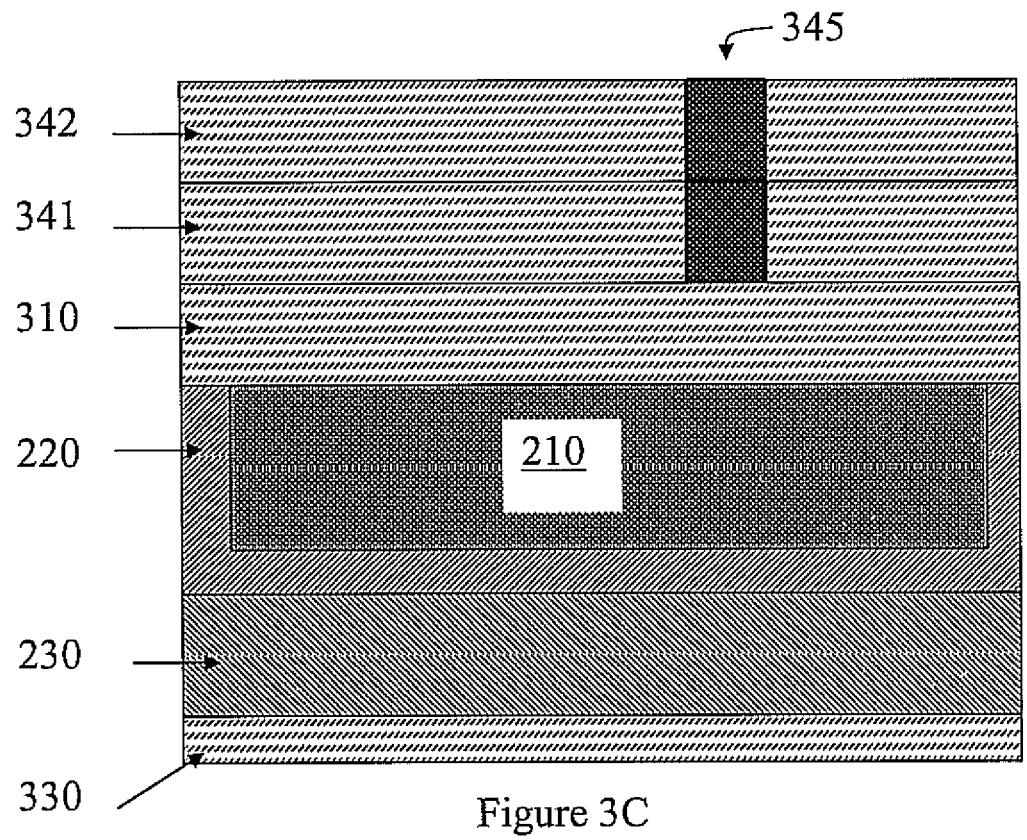
FIG. 3C illustrates repetitive doping of a plurality of epitaxial layers, in accordance with embodiments of the present invention.

FIG. 3C illustrates repetitive doping of a plurality of epitaxial layers, in accordance with embodiments of the present invention. For example, epitaxial layer 341 is grown, in a similar manner as illustrated by layer 320 (FIG. 3A). After formation of layer 341, a portion of layer 341, e.g., in region 345, is doped by well known processes. Subsequently, epitaxial layer 342 is grown over layer 341, and a portion of layer 342, e.g., in region 345, is doped by well known processes.

For example, if substrate 210 is doped with n-type dopants, epitaxial layers 310, 341, 342 may be n-type epitaxial layers. Regions 345 may be doped with p-type dopants. In this novel manner, a vertical column or well of a dopant type, e.g., p-type, may be created. Since each layer is individually grown and doped, the layer thickness, depth of doping, doping concentration, doping species and the like may differ with each layer growth and doping processes. It is to be appreciated that such a column or well may have characteristics, e.g., depth and/or doping levels and/or doping profiles, that are difficult or impossible to obtain via other doping methods, e.g., conventional well implantation from above a surface.

Figure 4:
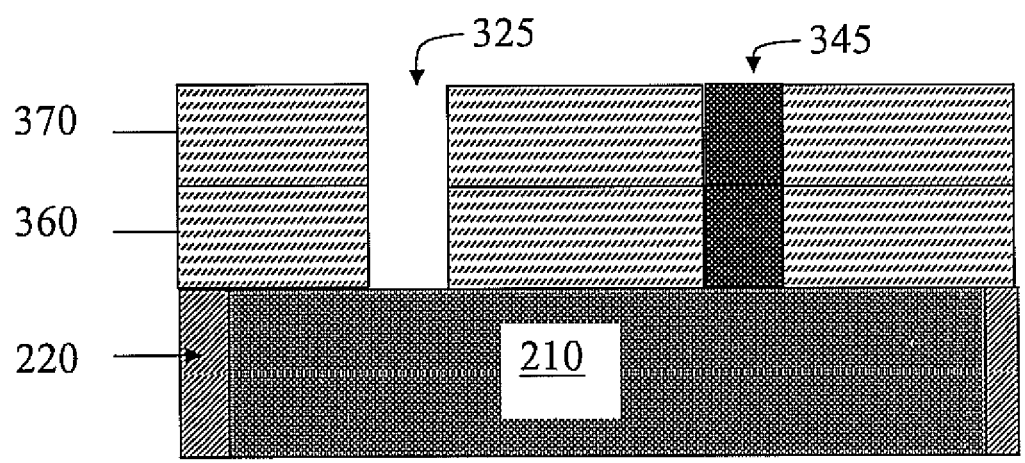
FIG. 4 illustrates a final semiconductor wafer substrate after further processing, in accordance with embodiments of the present invention.

FIG. 4 illustrates a final semiconductor wafer substrate after further processing, in accordance with embodiments of the present invention. As illustrated in FIG. 4, the depositions on the back side of wafer 210, e.g., epitaxy 330, poly Silicon 230 and the back side portion of Silicon oxide 220, may be removed, e.g., via grinding or back-lapping or other well known processes, such that wafer 210 has a desired thickness. The side/edge portions of Silicon oxide 220 may also be removed. However, it is to be appreciated that the edges of a wafer are generally not used for a final semiconductor device, and thus removal of such edge portions of Silicon oxide 220 may not be required.

FIG. 4 further illustrates optional vertical trench 325, formed by gaps in a plurality of epitaxial layers, e.g., epitaxial layers 360, 370. In addition, FIG. 4 illustrates an optional doped column 345, formed by repeating a cycle of growing a layer of epitaxial material and then doping such layer.

Embodiments in accordance with the present invention are well suited to the formation of semiconductor devices utilizing multiple epitaxial layers. For example, a trench, as utilized by well known trench semiconductors, e.g., a trench metal oxide semiconductor field effect transistor (MOSFET), may be formed by the growth of multiple, e.g., from two to 20, selectively grown epitaxial layers. Embodiments in accordance with the present invention eliminate, reduce or mitigate many deleterious effects of such multiple epitaxial growth cycles as may occur under the conventional art.

Embodiments in accordance with the present invention are also well suited to the epitaxial growth of non-Silicon materials on Silicon substrate(s). Non-Silicon epitaxial layers may include, for example, Gallium nitride (GaN), Silicon Carbide (SiC), sapphire, Germanium (Ge), Gallium arsenide (GaAs), Indium antimonide (InSb), Lead sulfide (PbS), Lead selenide (PbSe), and the like. In order to grow such non-Silicon material(s) on top of Silicon substrates, one or more buffer layers are generally first grown on top of a Silicon substrate, forming a buffer between the Silicon substrate and the non-Silicon epitaxial layer(s). Such buffer layers are generally intended to mitigate problems between silicon substrates and non-Silicon epitaxial layers such as seeding, lattice mismatching, stress relief, cracking free, etc. Exemplary buffer layers may comprise Aluminum nitride (AlN), Patterned Sapphire (PS), Hafnium nitride (HfN), Barium fluoride ($BaF_2$), and the like.

Generally, high temperature (800° C.-1250° C.) processing operations are needed in order to grow these buffer layers to provide good quality layers for the single crystal non-Silicon epitaxial layers. At this high temperature range (800° C.-1250° C.), Silicon substrates generally out-gas Silicon and/or Arsenic from the back side and edges of the substrate during buffer layer growth (see FIG. 1A). Such liberated gasses are deleteriously incorporated into a buffer layer (auto doping) resulting in a poor quality contaminated buffer layer. In turn, the contaminated buffer layer(s) leads to poor quality epitaxial layers disposed upon such contaminated buffer layer(s).

Embodiments in accordance with the present invention may form a seal to reduce and/or prevent such outgasing from the back and edges of a substrate during buffer layer growth. In this novel manner, high quality buffer layer(s) may be obtained, advantageously enabling high quality non-Silicon epitaxial layers to be grown on silicon substrates.

In summary, embodiments of the present invention provide systems and methods for substrate wafer back side and edge cross section seals. In addition, systems and methods of forming multiple epitaxial layers without the accumulation of deleterious side effects are provided. Further, systems and methods of forming multiple epitaxial layers with vertical trenches and/or vertical doped columns are provided. Still further, embodiments in accordance with the present invention provide systems and methods for substrate wafer back side and edge cross section seals that are compatible and complementary with conventional wafer processing systems Embodiments in accordance with the present invention are thus described. While the present invention has been described in particular embodiments, it should be appreciated that the present invention should not be construed as limited by such embodiments, but rather construed according to the below claims.

What is claimed is:

1. A method of growing epitaxial silicon on a silicon wafer, said method comprising:
   depositing a layer of silicon oxide on all surfaces and edges of said silicon wafer;
   removing said silicon oxide from a front surface of said silicon wafer;
   depositing a layer of poly silicon only on a back surface of said silicon wafer, over said silicon oxide;
   growing a layer of epitaxial silicon on said front surface of said silicon wafer;
   growing another layer of epitaxial silicon on said layer of epitaxial silicon; and
   doping a region of said layer of epitaxial silicon prior to said growing another layer of epitial silicon.

2. A method of growing epitaxial silicon on a silicon wafer, said method comprising:
   depositing a layer of silicon oxide on all surfaces and edges of said silicon wafer;
   removing said silicon oxide from a front surface of said silicon wafer;
   depositing a layer of poly silicon on a back surface of said silicon wafer, over said silicon oxide;
   growing a layer of epitaxial silicon on said front side of said silicon wafer; and
   growing another layer of epitaxial silicon on said layer of epitaxial silicon, wherein said another layer of epitaxial silicon comprises a gap characterized by an absence of epitaxial silicon.

* * * * *